United States Patent [19]

Douglas

[11] Patent Number: 4,784,720

[45] Date of Patent: Nov. 15, 1988

[54] TRENCH ETCH PROCESS FOR A SINGLE-WAFER RIE DRY ETCH REACTOR

[75] Inventor: Monte A. Douglas, Coppell, Tex.

[73] Assignee: Texas Instruments Incorporated, Dallas, Tex.

[21] Appl. No.: 71,111

[22] Filed: Jul. 8, 1987

Related U.S. Application Data

[63] Continuation-in-part of Ser. No. 26,491, Mar. 16, 1987, and a continuation-in-part of Ser. No. 841,502, Mar. 19, 1986, abandoned, and a continuation-in-part of Ser. No. 841,391, Mar. 19, 1986, Pat. No. 4,690,729, and a continuation-in-part of Ser. No. 730,701, May 3, 1985, Pat. No. 4,702,795.

[51] Int. Cl.$^4$ .................. H01L 21/306; B44C 1/22; C03C 15/00; B05D 3/06
[52] U.S. Cl. ............................. 156/643; 156/646; 156/648; 156/653; 156/657; 156/659.1; 156/662; 204/192.37; 204/192.23; 252/79.1; 427/38; 437/228; 437/234; 437/238; 437/241

[58] Field of Search ............... 156/643, 646, 648, 653, 156/657, 659.1, 662; 252/79.1; 204/192.11, 192.22, 192.23, 192.37; 357/23.6, 47, 51, 55; 427/38, 39; 437/61, 65, 66, 72, 73, 228, 234, 238, 241

[56] References Cited

U.S. PATENT DOCUMENTS 4,533,430 8/1985 Bower .................................. 156/643
4,690,729 9/1987 Douglas ............................. 156/643

Primary Examiner—William A. Powell
Attorney, Agent, or Firm—Thomas W. DeMond; Douglas A. Sorensen; Melvin Sharp

[57] ABSTRACT

A plasma dry etch process for trench etching in single slice RIE etch reactors wherein a selective sidewall passivation is accomplished to control the profile of the trench being etched. The process comprises methods of passivating the sidewall by passivation on a molecular scale and by passivation by a veneer type passivation comprising buildup of a macroscopic residue over the surface of the sidewall. Several methods are disclosed for forming and shaping the passivating layers (both mono-atomic and bulk). By carefully controlling the composition and shape of the sidewall passivating veneer in conjunction with other etch factors, the desired trench profiles can be achieved.

29 Claims, 1 Drawing Sheet

TRENCH ETCH PROCESS FOR A SINGLE-WAFER RIE DRY ETCH REACTOR

CROSS-REFERENCE TO RELATED APPLICATIONS

The present invention is a continuation-in-part of the following applications: Ser. No. 026,491, filed 03/16/87, pending; Ser. No. 841,391, filed 03/19/86, U.S. Pat. No. 4,690,729; Ser. No. 841,502, filed 03/19/86, abandoned; and Ser. No. 730,701, filed 05/03/85, U.S. Pat. No. 4,702,795.

FIELD OF THE INVENTION

The present invention relates to the field of plasma etching and more particularly to the field of plasma etching in semiconductor substrates.

BACKGROUND OF THE INVENTION

Fabrication of trenches—i.e., grooves etched in the substrate of an integrated circuit which (regardless of their length) have an aspect ratio (depth to width ratio) greater than approximately 1:1—is desirable in several areas of ULSI (ultra large scale integration) processing. Trench etch processing has become critical to the fabrication of state-of-the-art electronic devices exploiting three dimensional structural concepts such as trench capacitors, trench isolation, and trench transistors. However, fabrication of such trench strucures presents several distinctive difficulties at which the present invention is aimed.

There are many problems associated with trench etch processing. Some of these include achieving an acceptable etch rate, etch rate uniformity, etch selectivity, mask selectivity, mask type, critical dimension control, silicon surface defects, reactant loading and reactor residue buildup.

However, another set of problems concern the characteristics of the silicon trench itself, which characteristics must be carefully controlled to achieve satisfactory results in the applications proposed for trench structures. The trench cross-sectional profile is of particular concern: for instance, trench profiles where the silicon is undercut with respect to the patterning mask or where "grooving" (also termed "cusping") is exhibited near the bottom of the trench are commonly observed with conventional trench etch processing. Such undercutting and grooving are extremely undesirable in ULSI applications. Even minutely undercut sidewall profiles will readily promote void formation during the subsequent CVD refill operations commonly used in typical device processing. These voids are a problem because they can act as a contaminant depository. Moreover, a later etchback step may reopen the void, producing filament problems if a conductor is sought to be patterned thereafter. Moreover, etchback to achieve a truly planar surface within the trench, as is desirable for some advanced processes, becomes impossible. The trench bottom "grooving" can also be exceedingly deleterious: it can degrade the dielectric integrity of a trench capacitor and can promote high, stress-related Si defect densities during thick thermal oxidation.

Additional structural features in trench profiles commonly considered damaging for device applications include trench sidewall "ledges", rough silicon sidewall surfaces, a negative slope on the trench sidewall profile and trench sidewall nonlinearity.

Another problem of the prior art is a peculiar form of undercut which may be referred to as retrograde undercut, or bowing. This is different from the ordinary forms of undercut in that the amount of undercut will be almost zero next to the mask, and will typically increase with depth for a distance of a micron or more.

In applicant's co-pending parent applications, Ser. Nos. 026,491; 841,391; 841,502; and 730,701, applicant disclosed methods for trench fabrication in a relatively low pressure batch etcher environment. In these applications a batch reactive ion etching ("RIE") reactor process is disclosed having trench etch capability. The disclosed processes operate at low process pressures (less than 20 millitorr) emphasizing electron-impact ionization processes, so surface ion-impact processes dominate over neutral radical processes. The ion directionality and low pressure conditions contribute to the trench profile control which is critical to subsequent successful trench processing and good device performance. Batch systems overcome the wafer throughput limitations associated with deep silicon etching by processing a large number of wafers at a moderate etch rate, effecting a large equivalent single-wafer etch rate exceeding one micron per minute. Finally, batch processing permits multiple steps without significantly degrading wafer throughput. By manipulation of the process chemistry the trench structure can be tailored as a function of depth to eliminate or avoid trench structural defects that occur at several levels.

It has been proposed, however, that conventional batch reactors and, consequently, batch reactor processes are less than optimally suited for production environments. The present invention, alternatively, proposes a single wafer trench etching process which avoids limitations arising from the batch processing environment. Among the limitations of batch reactor capabilities for trench etch processes are the following:

(a) they are very expensive compared to competitive single-wafer dry etchers, particularly when retrofitted with a load lock assembly critical to operator safety and process capability and reproducibility;

(b) they exhibit very poor Si: Photoresist etch rate ratios;

(c) they exhibit relatively high etch rate and trench profile nonuniformities from position-to-position within the reactor (critical considerations when etching silicon trenches where an etch stop substrate often does not exist);

(d) they exhibit strong loading effects since low flows are used relative to both the number of wafers and degree of ion bombardment which significantly lowers the silicon etch rate when the exposed silicon area is enlarged beyond a small percentage;

(e) they are very difficult to clean up and for processes that have a tendency to deposit material on the chamber walls (as is characteristic of the trench etch), the forced down time is almost intolerable;

(f) they are very difficult to qualify due to the large number of positions in the reactor (for trench etch, each position requires SEM analysis of the trench profile). Furthermore, frequent qualification of the reactor is required for trench processing since wafer-substrate contact can readily degrade, driving poor profiles, and the frequent difficult clean ups involve mechanical hardware adjustment which merits subsequent requalification;

(g) endemic to batch processing is the inability to perform customized end point assessment for each wafer;

(h) due to the expense of each wafer, which is increasing as wafer sizing increases, it is imprudent to commit a large number of wafers to a single run due to the extreme financial liability associated with the processing;

(i) it is very difficult to develop processes in batch systems due to the time involved in conducting each experiment (which may be as long as 3-4 hours for a trench etch experiment) and the difficulty in establishing a "batch" process once successful results are achieved on a single wafer/position.

Accordingly, it is considered desirable to conduct trench etch processes on a slice by slice basis in a single slice reactor. However, prior art attempts at single wafer trench etching have failed or been unacceptable for a variety of reasons including poor trench profile control and/or low etch rates for silicon.

SUMMARY OF THE INVENTION

The present invention comprises methods of trench etching in a single slice plasma reactor environment. During the plasma etching of trenches into the silicon substrate, selective deposition of materials from the plasma to the sidewalls of the trenches being etched is accomplished to form a passivating veneer of materials on the sidewalls. The sidewall veneer serves to affect the profile and characteristics of the trench being etched. The sidewall veneer protects the silicon surface of the sidewall from ion bombardment, inhibits the volatilization of species from the sidewall, blocks the sidewall from contact with certain reactive species in the plasma and shadows lower trench surfaces from ion bombardment as well as accomplishing additional desired results. By carefully controlling the composition and shape of the sidewall veneer in conjunction with other etch factors, the desired trench profile can be achieved. The sidewall veneer also comprises methods of sidewall passivation on a molecular scale. During the etch process the sidewall deposits can be modified to further affect the profile and characteristics of the trench being etched.

The present invention comprises a method of selective sidewall passivation of the sidewall of the trench being formed to accomplish predefined trench profile objectives. This overall method comprises methods of both passivation of the silicon sidewall on a molecular scale and a veneer type or bulk passivation of the sidewall as well.

The present invention comprises several methods, which can be and are used in conjunction with each other, of forming and controlling the sidewall veneer. One method is to include in the plasma at least one etchant which reacts with silicon atoms of the silicon substrate to form etch products and other reaction products which deposit on the trench sidewall. Another method comprises including in the plasma species which, either by themselves or in combination with other species in the plasma or on the substrate surface, precipitate onto or form on the side wall of the trench. This method also comprises including in the plasma species which dissociate in the plasma environment and subsequently combine with other species to form a veneer on the trench sidewall. Another method is to include in the plasma at least one species which bonds to a site on the silicon surface of the trench reducing the likelihood of subsequent reactions of that silicon site to silicon etchants in the plasma leading to volatilization of the silicon surface. Yet another method is to provide other sidewall passivating agents in the plasma of the etch.

In certain embodiments of the present invention, the sidewall veneer is deposited on the trench sidewall in such a fashion that it is thicker at the mouth of the trench than it is near the bottom of the trench. During the progress of the etch, the shape of the sidewall veneer can be modified to affect the profile or other characteristics of the trench being etched. One method of modifying the shape of the sidewall veneer is to forward sputter the material of the sidewall veneer from positions nearer the mouth of the trench to positions nearer the bottom of the trench. Yet another method which can also be used conjunctively, is to include in the plasma at least one species which removes, or selectively removes, at least a portion of the materials of the sidewall veneer.

The present invention provides numerous advantages over prior methods, including:

(a) Improved etch rates;
(b) Improved etch ratios;
(c) Improved trench profile control;
(d) Positive slope trench sidewall for facile refill processing;
(e) Eliminates trench bottom "cusping" if there is a tendency;
(f) Eliminates sidewall ledges;
(g) Protects directly, or by shadowing, the sidewall from ion bombardment, reducing radiation damage;
(h) Provides linear sidewalls;
(i) Provides smooth, clean sidewalls;
(j) Eliminates retrograde bowing;
(k) Eliminates any tendency to etch laterally or undercut, especially buried n+ layers;
(l) No loss of critical dimension defined lithographically, that is, line width loss is non-existent;
(m) High etch rate uniformity across the slice;
(n) Allows for customized end point assessment for each wafer;
(o) Provides a process which is relatively clean—not resulting in formation of deposits or precipitates on the walls of the reactor vessel;
(p) Provides a process which can be carried out in a single slice reactor which is relatively inexpensive, easy to clean, and for which it is relatively easy to optimize processes in comparison with batch reactors.

BRIEF DESCRIPTION OF THE DRAWINGS

The present invention will be described with reference to the accompanying drawings, wherein.

DESCRIPTION OF THE PREFERRED EMBODIMENTS

Figure 1:
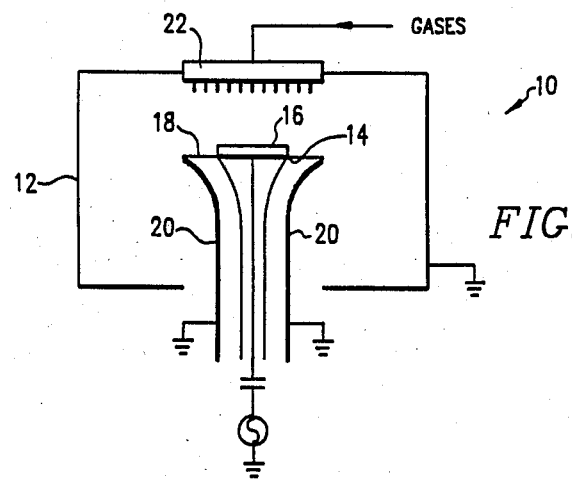
FIG. 1 is a diagramatic side view of a single slice RIE reactor in accordance with the present invention.

The present invention comprises methods of plasma trench etching for use in conjunction with single slice RIE etch reactor environments. Shown in FIG. 1 is a diagramatic side view of a single slice RIE reactor in accordance with the present invention. The reactor 10 comprises chamber walls 12, which are grounded and serve as the anode of the system, a substrate 14 connected to an RF power source and serving as the cathode of the system, the substrate 14 also supporting a wafer 16. A teflon ring 18 insulates the substrate 14 and wafer 16 from side structures 20 which are also grounded. A showerhead 22 which is also grounded disperses gases into the chamber. Not shown in FIG. 1 is a wafer clamp to compress the wafer 16 against the substrate 14 to insure peripheral wafer contact. Also not shown in FIG. 1 is a cooling means for drawing thermal energy away from the wafer 16 by way of the substrate. In one embodiment, the cooling means comprised a helium chuck cooled with circulating water.

In one embodiment of the present invention the reactor was constructed to establish a large plate spacing to permit the plasma to partially expand to allow increased area contact with the anode. The anode:cathode area ratio was about 2:1 which derives high D.C. bias voltages characteristics of the RIE condition.

In the practice of the present invention a wafer having either a photoresist mask or hard (SiO2) mask defining sites for formation of the trenches is positioned on the substrate 14. After appropriate evacuation of the chamber, a predetermined flow of gases is accomplished through the showerhead 22, RF power is supplied through the substrate 14, a plasma of excited species is produced within the chamber, and the etching process is begun on the wafer.

Figure 2:
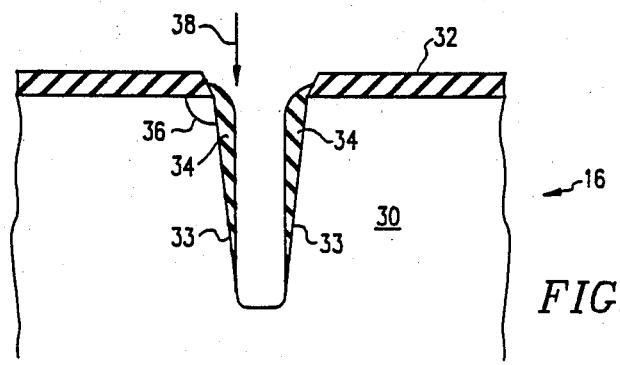
FIG. 2 is a diagramatic cross-sectional side view of a trench being etched according to the methods of the present invention.

FIG. 2 shows a diagramatic side view of a trench being etched according to the methods of the present invention. Shown in FIG. 2 is the wafer 16 having a silicon substrate 30 and a mask 32 which defines the region for formation of the trench. The trench shown in FIG. 2 is partially complete and has sidewalls 33 on which has been formed a sidewall deposit or veneer 34. The sidewall 33 forms an angle 36 with the surface of the silicon substrate 30 which is greater than 90 degrees, showing that the sidewall has a desired positive slope. The term "profile angle" of a trench sidewall is often referenced to the supplementary angle to angle 36. Accordingly, in that terminology, the profile o the trench sidewall of FIG. 2 is less than 90°. Arrow 38 figuratively illustrates the direction of ion bombardment in the etch process. As can be seen in FIG. 2, the buildup of sidewall deposits is thicker near the mouth of the trench than it is near the bottom of the trench.

During the plasma etching of the wafer 16, formation of the veneer 34 of materials on the sidewall 3 of the trench is accomplished by selective deposition of materials from the plasma to the sidewalls as well as molecular scale passivation mechanisms. In the practice of the present invention, the sidewall veneer 34 is formed, shaped and modified to affect the profile and characteristics of the trench being etched. The sidewall veneer protects the silicon surface of the sidewall from ion bombardment, inhibits the volatilization of species from the sidewall, blocks the sidewall from contact with certain reactive species in the plasma and shadows lower trench surfaces from ion bombardment as well as accomplishing additional desired results. By carefully controlling the composition and shape of the sidewall veneer in conjunction with other etch factors, the desired trench profile can be achieved. During the etch process the sidewall deposits can be modified to further affect the profile and characteristics of the trench being etched.

The present invention comprises a method of selective sidewall passivation of the sidewall of the trench being formed to accomplish predefined trench profile objectives. This overall method comprises methods of both passivation of the silicon sidewall on a molecular scale and a veneer or bulk type passivation of the sidewall as well. Passivation on a molecular scale involves direct bonding or aductive bonding by a reactive agent to a reactive site on a surface, thus inhibiting subsequent reaction at that site with reagents that would form a volatile product. Veneer or bulk type passivation involves buildup of a macroscopic residue over a surface, physically protecting the surface from reaction with volatilizing etchants and protecting that or other surfaces from impinging ions. The veneer selectively deposited on the trench sidewall according to embodiments of the present invention can provide both molecular scale and veneer type passivation to the sidewall. In some cases there is an apparent overlap between the mechanism by which some species passivate the sidewall and it is difficult to define when one mechanism ends and another begins.

In the practice of the present invention, several methods can be used individually or in conjunction with each other to accomplish the sidewall passivation desired. With regard to the veneer type passivation, several methods can be used to form and control the sidewall veneer during the etch of the trench. One method is to include in the plasma at least one etchant which reacts with silicon atoms of the silicon substrate to form etch products (as well as other reaction products) one or both of which deposit on the trench sidewall. Another method comprises including in the plasma species which, either by themselves or in combination with other species in the plasma or on the substrate surface, precipitate onto or form on the sidewall of the trench. This method also comprises including in the plasma species which dissociate in the plasma environment and subsequently combine, frequently with other species, to form a veneer on the trench sidewall.

Molecular scale passivation can be accomplished by including in the plasma at least one species which bonds to a site on the silicon surface of the trench reducing the likelihood of subsequent reactions of that or related silicon sites to silicon etchants in the plasma leading to volatilization of the silicon surface. In some embodiments, the etchant used provides such a passivating species. The passivating species also serves to protect the silicon site from ion bombardment. In some embodiments the veneer accomplishing the molecular scale passivation is only a mono-atomic layer and may not be uniform across the silicon surface.

In certain embodiments of the present invention, the sidewall veneer is deposited on the trench sidewall in such a fashion that it is thicker at the mouth of the trench than it is near the bottom of the trench. During the progress of the etch, the shape of the sidewall veneer can be modified to affect the profile or other characteristics of the trench being etched. One method of modifying the shape of the sidewall veneer is to forward sputter the material of the sidewall veneer from positions nearer the mouth of the trench to positions nearer the bottom of the trench. Yet another method, which can also be used conjunctively, is to include in the plasma at least one species which removes, or selectively removes, at least a portion of the materials of the sidewall veneer. Additional methods include various combinations of altering the concentrations and timing of flows of certain species in the plasma during the etch to accomplish the veneer characteristics in conjunction with the etch conditions necessary to result in the desired trench profile. Additional methods and permutations of varied etch conditions to form and affect the sidewall veneer could also be used and are encompassed by the present invention.

Figure 3:
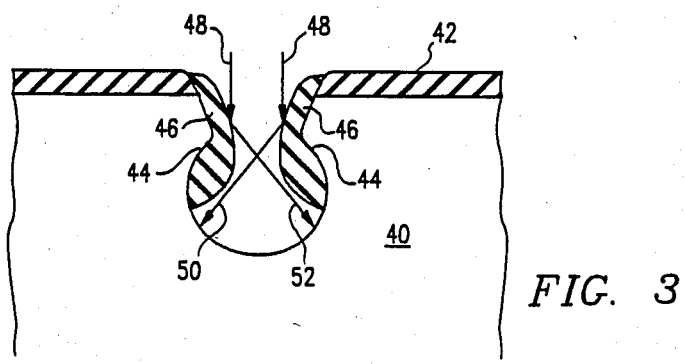
FIG. 3 is a diagramatic cross-sectional side view of a trench etched where retrograde bowing of the sidewall has occurred.

It is important that the shape and location of the sidewall veneer be carefully controlled. FIG. 3 shows a cross-sectional side view of a trench etched where the sidewall deposits have become too large or of an undesired shape and retrograde bowing of the sidewall has occurred. Shown in FIG. 3 is a silicon substrate 40, a mask 42, the trench sidewalls 44 and areas of materials deposited on the sidewalls 46. Lines 48 indicate the direction of ion bombardment induced by the RF power source of the reactor. Lines 50 and 52 show illustrative directions of ion bombardment to lower areas of the trench after the ions have impinged on and been misdirected from the sidewall material 46. It has been found that overgrowth of, or incorrect shaping of, the sidewall deposits can lead to retrograde bowing and other undesirable profile characteristics. It is suggested that one cause of the bowing is the misdirection of ions after they impinge on the sidewall deposits. Moreover, the oversized deposition can be forward sputtered to the bottom of the trench, slowing the silicon etch rate in the are of the bottom of the trench away from the sidewalls, resulting in "grooving". In addition, the sidewall buildup can be so oversized as to actually pinch off the trench opening, precluding further trench etching.

It has been found that the relatively low pressures (e.g. 20 millitorr) of batch RIE reactors are not well suited for application to trench etching processes in single slice RIE reactors. Extremely high D.C. bias voltages are observed (approximately 3000 volts) in the single slice RIE reactor, these high voltages produce considerable damage in the silicon of the substrate. Moreover, low pressure conditions (without application of the inventive process chemistry described herein) with a single slice reactor yield low etch rates and very poor Si:Mask etch rate ratios. Higher pressures are preferably used in the single slice reactor to successfully overcome the preceding problems. Pressures of from 100 to 750 millitorr have been successfully applied in processes according to the present invention, although greater or lesser pressures have also been successfully used. However, higher pressures, provided alone, promote lateral etching and retrograde bowing due to high neutral radical flux relative to the ion flux and lack of ion directionality due to increased ion-neutral collisions in the plasma above and in the trench opening experienced at higher pressures. The present invention eliminates these problems of undercut and retrograde bowing by the implementation of the selective sidewall passivation methods described herein. In preferred methods an etchant is selected, preferable a bromine liberating agent or source, which not only serves as an etchant but which also serves to enhance the sidewall passivation effects and eliminate undercut and retrograde bowing.

The overall method of the present invention is to selectively passivate the sidewall of the trench during the etch process. A method in this overall process is the use of etchants which react with silicon atoms to form etch products, one or both of which, precipitate onto the trench sidewall. Additionally, gaseous precipitating agents are preferably introduced into the plasma. These precipitating agents combine with the etchants, etch products and other species to form materials which partially comprise the sidewall passivating veneer. A preferred etchant for this method is HBr. In the present invention, HBr reacts with silicon to form $Si_xBr_y$ etch products which, due to their low volatility and the high local pressure, readily stick to and buildup on the sidewall in the absence of ion bombardment. Accelerated build up at the mouth of the trench frequently occurs and is probably due to the reaction of $Si_xBr_y + Si_aO_b$ to form $Si_dO_eBr_f$ which deposits on the sidewall. The source of the $Si_aO_b$ in many cases is the hard mask on the substrate. This extra buildup along the trench mouth helps to reduce sidewall ion bombardment by shadowing the lower trench recesses. If the buildup is carefully controlled, a positive profile will result.

Any bromine source, such as $Br_2$, HBr, $CF_3Br$, or similar compounds can be used as a silicon etchant and to also provide the sidewall selective deposition according to the present invention. Bromine-based chemistries in many etch conditions provide superior results due to the poor volatility of $Si_xBr_y$ etch products, although other low volatility etch products may also be used, e.g. HI to form $Si_xI_y$, etc. The bromine also serves to passivate the silicon sidewall by molecular scale passivation mechanisms. Chlorine liberating sources may also be used as etchants but are less preferred due to the relatively higher volatility of $Si_xCl_y$ compounds as compared to the bromine compounds. Chlorine does not provide as good a molecular scale passivation as does bromine. In other embodiments other halogen sources may be used as etchants.

Gaseous precipitating agents which can be used include $N_2$, NO, $NO_2$, $CO_2$, CO, $O_2$, $CS_2$, CS, and other similar species which combine to form products with low volatility. This results in precipitation of a residue onto the trench sidewall which results in veneer type passivation of the surface. The passivating agents can, as pointed out above, combine with species of the etchants or etch reaction products. Additionally, the passivating agents can combine with other species in the plasma or on the substrate or veneer. For example, it has been found that the addition of nitrogen sources, such as $N_2$ or NO, in conjunction with the bromine type silicon etchants enhances the formation of sidewall deposits. It is thought that the addition of nitrogen sources leads to formation of $Si_xBr_yN_z$ precipitates which form on the trench sidewall. Another example is the combination of $SCl_4$ with $N_2$ to form a precipitate. Additionally, NO, CO, and $O_2$ also combine with $SiCl_4$ to form a precipitate.

Another method used in conjunction with the present inventions, at one or more predetermined times in the etching process, to include in the plasma of the etching operation an agent which serves to passivate the sidewall on a molecular scale. Molecular scale passivation can be accomplished by at least one species which bonds either directly or aductively to a site on the silicon surface of the trench reducing the likelihood of subsequent reactions of that or related silicon sites with silicon etchants in the plasma leading to volatilization of the silicon surface. In some embodiments, the etchant used provides such a passivating species. The passivating species also serves to protect the silicon site from ion bombardment. In some embodiments the veneer accomplishing the molecular scale passivation is only a mono-atomic layer and may not be uniform across the silicon surface. The sidewall passivating agent combines with the silicon of the sidewall and decreases the probability of the silicon reacting with other species in the plasma and volatilizing from the trench sidewall. Appropriate use of one or more sidewall passivating agents, alone or in conjunction with other methods of the present invention, provides added control in the formation of the trench profile according to the present invention. Examples of molecular scale passivating agents (other than the etchants earlier identified as providing molecular scale passivation) include $BCl_3$, CO, $SiCl_4$, NO, CS, $CS_2$, $AlCl_3$, methane and ethane. Some of these molecular scale passivating agents serve a dual role, providing or enhancing veneer type passivation as well as providing molecular scale passivation.

Another method of providing and enhancing veneer type passivation is to include in the plasma monomeric organic or inorganic moleclar species which dissociate in the plasma to form, either in the plasma or on a surface, organic or inorganic polymeric residues with low volatility. These residues then deposit on the trench sidewall producing veneer type passivation. Examples of such species include hydrocarbons such as methane, ethane, ethylene or other hydrocarbons which polymerize in the plasma environment. Moreover, these organic agents can polymerize with inorganic reagents to form a hybrid organic/inorganic residue. Examples of other species include $CCl_4$, freons, $BCl_3$ as well as inorganic species which react with other species in the process.

Once the sidewall deposits have been formed, several methods have been invented to modify the shape of the veneer to enhance the formation of desired trench profiles. These methods include forward sputtering of the sidewall deposits or also adding agents to the plasma which serve to etch the sidewall deposits. The method of forward sputtering the sidewall deposits comprises forward sputtering at least a portion of the material which has been selectively deposited on the trench sidewall to positions on the trench sidewall nearer the bottom of the trench. Inasmuch as the selectively deposited material on the sidewall often comprises a low grade, off-stoichiometry, amorphous deposition it is more readily forward sputtered than is the silicon dioxide hard mask. This provides veneer type passivation to the lower regions of the sidewall. This phenomena also inhibits formation of an overly thick sidewall residue at the mouth of the trench.

Another method of modifying the sidewall deposits is to include in the plasma at predetermined times in the etch, agents which etch or reduce the materials which have been deposited on the trench sidewalls. Examples of such agents include $SiCl_4$, $BCl_3$, $SF_6$, $CF_4$, $NF_3$, as well as other species which will remove the sidewall deposits.

It should be noted that the flows of the various species can be varied at predetermined times or periods in the etch to accomplish the particular trench profile development desired.

In certain embodiments of the present invention it is important to maintain the substrate in which the trenches are being etched at a reduced temperature. The reduced temperatures serve to inhibit the volatilization of species from the trench sidewall.

It should be noted that the selective deposition of gas phase precipitates and the silicon passivating occur in many cases to the bottom of the trench as well as to the sidewall of the trench. However, the more direct ion bombardment of the bottom of the trench as compared to the sidewalls tends to remove the deposition and passivating layers from the silicon at the bottom of the trench.

Embodiments of the present invention are illustrated in the following examples.

EXAMPLE NO. 1

The following describe etch conditions and etch results used to generate deep silicon trenches in a single-wafer RIE reactor:

Etch conditions:
(a) Single-wafer, RIE reactor illustrated in FIG. 1;
(b) Four-inch plate spacing;
(c) 5° C. substrate temperature;
(d) 50° C. showerhead temperature;
(e) Slice clamp;
(f) Crowned substrate;
(g) Trench capacitor array pattern: 5-10% exposed Si area;
(h) Oxide hard mask;
(i) 350 watts;
(j) 650 millitorr;
(k) HBr—50 sccm;
(m) $BCl_3$—5 sccm;
(p) Etched for 5 minutes.

Etch results:
(a) Si etch rate—17,000 angstroms/min.;
(b) $SiO_2$ hardmask etch rate—280 angstroms/min.;
(c) Si:$SiO_2$ etch rate ratio—60:1; and
(d) Si etch rate nonuniformity plus or minus 2%;
(e) Trench depth—8.5 microns;
(f) Aspect ratio—8:1.

EXAMPLE NO. 2

The following describe etch conditions and etch results used to generate deep silicon trenches in a single-wafer RIE reactor:

Etch conditions:
(a) Single-wafer, RIE reactor illustrated in FIG. 1;
(b) Four-inch plate spacing;
(c) 5° C. substrate temperature;
(d) 50° C. showerhead temperature;
(e) Slice clamp;
(f) Crowned substrate;
(g) Trench capacitor array pattern: 5-10% exposed Si area;
(h) Oxide hard mask;
(i) 500 watts;
(j) 350 millitorr;
(k) HBr—50 sccm;
(m) $SiCl_4$—5 seem;
(o) CO—40 sccm;
(p) Etched for 4 minutes.

Etch results:
(a) Si etch rate—2 microns/min;
(b) Trench profile 89° (91° as defined in FIG. 2;
(c) Si:$SiO_2$ etch rate ratio—15:1; and
(d) Si etch rate nonuniformity plus or minus 1%;
(e) Trench depth—8 microns;
(f) Aspect ratio—10:1 (feature size was smaller than that of Example No. 1, which led to higher aspect ratio).

Experiments have shown the following etch trends:
(a) Increasing process pressure increased Si etch rate, increased Si:$SiO_2$ etch rate ratio, and increased tendency to produce retrograde bowing, except in the presence of CO which increased the slope of the sidewall;
(b) Increasing power increased Si etch rate, decreased Si:$SiO_2$ etch rate ratio, and decreased tendency to produce retrograde bowing up to the point where the wafer reached a temperature that volatilized the sidewall deposition reducing passivation, resulting in retrograde (c) Increasing HBr flow increased Si etch rate;

(d) BCl$_3$ helps to etch the native SiO$_2$ to eliminate "black Si" or speckles. Higher flows decrease Si:-SiO$_2$ etch rate ratio. Other oxide etch species, such as SiCl$_4$, CF$_4$, NF$_3$, can be used in lieu of BCl$_3$;

(e) At higher process pressures, a trend toward decreased etch rates as a function of increased aspect ratio is increased. However, lower process pressures produce "cusping" at the trench bottom (50 millitorr), but at process pressure of approximately 400 millitorr rounded and preferred trench bottoms are produced; and (f) Adding Cl$_2$ or HCl increases the silicon etch rate but may produce retrograde bowing.

Preferred combinations of gas flows in the plasma of the process comprise:

(a) HBr, BCl$_3$ (at approximately 1/10 to 1/5 the flow of the HBr), N$_2$ (at approximately the same flow as the HBr);

(b) HBr, BCl$_3$, CO (at approximately the same flow of CO as for HBr);

(c) HBr, SiCl$_4$, CO;

(d) HBr, SiCl$_4$, N$_2$;

(e) HBr, SiCl$_4$, NO (with NO flow preferably not exceeding 5 sccm);

(f) HBr, BCl$_3$, NO (with NO flow preferably not exceeding 5 sccm); and (g) HBr, BCl$_3$, SiCl$_4$, N$_2$.

The preferred flows for HBr are 15–250 sccm more preferably 25–150 sccm, and yet more preferably 35–75 sccm. Preferred flows for BCl$_3$ are 1–15 sccm, more preferably 3–10 sccm, and yet more preferably approximately 5 sccm. Preferred flows for N$_2$ are 5–150 sccm, more preferably 20–100 sccm, and yet more preferably 30–60 sccm. Preferred power levels are 1–15 watts/cm$^2$ of wafer, more preferably 3–10 watts/cm$^2$, and yet more preferably approximately 5 watts/cm$^2$. Preferred section pressures are 10–2000 millitorrs, more preferably 50–1000 millitorrs, and yet more preferably 200–750 millitorrs.

It should be noted that, as pointed out in the applicant's co-pending applications earlier noted, some of the SiO$_2$ hard mask can be forward sputtered onto the trench sidewalls. Although this occurs to a lesser degree in the relatively higher pressure environments of the preferred embodiments of the present invention, it does to some degree add to the sidewall passivating veneer of the present invention.

Although the present invention has been described in conjunction with the etching of trenches in silicon substrates, the invention is not limited in application to only silicon substrates but can applied to trench etching processes in other substrates as well.

Additionally, although the processes of the present invention have been described in conjunction with single slice processes, the present invention is not limited to single slice processes and can be applied to batch processes and lower pressure processes, particularly where appropriate conditions are provided.

It should be understood that the present invention can be applied in the production of all manner of semiconductors and other devices, particularly where accurate control of a trench structure is desired in a substrate.

While preferred embodiments of the present invention and their advantages have been set out in the above description, the invention is not limited thereto, but only by the spirit and scope of the appended claims.

What is claimed is:

1. A process for etching a trench in a substrate, comprising the steps of:
   etching a trench in a predetermined trench location of said substrate by means of a plasma source of etchants and ions;
   selectively depositing materials on the sidewalls of said trench to control the profile of the trench being etched.

2. A process for etching a trench in silicon, comprising the steps of:
   etching a trench in a predetermined trench location of said silicon substrate by means of a plasma source of silicon etchants and ions;
   selectively depositing materials on the sidewalls of said trench to control the profile of the trench being etched.

3. The process of claim 2, wherein said step of selectively depositing materials comprises:
   selectively depositing materials from the plasma onto the sidewalls of said trench to control the profile of the trench being etched.

4. The process of claim 3, further comprising:
   including in said plasma an etchant which reacts with silicon atoms of said silicon substrate to form etch products which deposit on the trench sidewall.

5. The process of claim 4, further comprising:
   including in said plasma at least one species which bonds to a silicon surface of said trench and is not readily displaced by silicon etchants in the plasma to volatilize the silicon surface.

6. The process of claim 3, further comprising:
   including in said plasma at least one species which bonds to a silicon surface of said trench and is not readily displaced by silicon etchants in the plasma to volatilize the silicon surface.

7. The method of claim 4, further comprising:
   forward sputtering at least a portion of the material selectively deposited on the trench sidewall to a position on the trench sidewall nearer the bottom of the trench.

8. The method of claim 7, further comprising:
   including in said plasma at a predetermined time in said etch process an agent which removes at least a portion of said materials selectively deposited on said trench sidewall.

9. The method of claim 6, wherein said material selectively deposited on said trench sidewall is thicker near the mouth of the trench than it is near the bottom of the trench.

10. The method of claim 9, wherein the material selectively deposited near the mouth of said trench serves to reduce sidewall ion bombardment by shadowing the lower trench sidewalls.

11. The method of claim 10, further including:
    forward sputtering silicon dioxide from an upper region of said silicon substrate to positions on the trench sidewall near the mouth of the trench.

12. The method of claim 3, further including:
    modifying during said etch process said material selectively deposited on said trench sidewall to vary the profile of the trench being etched.

13. The method of claim 5, further including:

modifying during said etch process said material selectively deposited on said trench sidewall to vary the profile of the trench being etched.

14. The method of claim 4, wherein said etchant comprises a halogen source.

15. The method of claim 14, wherein said etchant comprises at least one of:
   a bromine source;
   a chlorine source; and
   an iodine source.

16. The method of claim 14, wherein said etchant comprises at least one of: HBr, $Br_2$, $CF_3Br$, HCl, and HI.

17. The method of claim 4, wherein said etch products, in conjunction with one of oxygen and nitrogen, form a product which deposits on the sidewall of the trench.

18. The method of claim 14, wherein said etch products, in conjunction with one of oxygen and nitrogen, form a product which deposits on the sidewall of the trench.

19. The method of claim 17, wherein said etch products, in conjunction with one of oxygen and nitrogen, form a product which deposits on the sidewall of the trench.

20. The method of claim 3, further comprising including in said plasma species which combine to form polymeric residues on the sidewall of said trench.

21. The method of claim 20, wherein said polymeric residues comprise organic polymeric residues.

22. The method of claim 20, wherein said polymeric residues comprise inorganic polymeric residues.

23. The method of claim 3, further comprising: including in said plasma gaseous HBr, $BCl_3$ and $N_2$.

24. The method of claim 3, further comprising:
   including in said plasma gaseous HBr, $BCl_3$ and CO.

25. The method of claim 3, further comprising:
   including in said plasma gaseous HBr, $SiCl_4$ and 26. A process for etching a trench in a silicon substrate, comprising the steps of:
   etching a trench in a predetermined trench location of said silicon substrate by means of a plasma source of ions;
   passivating the sidewalls of the trench by deposition of materials on the sidewalls to control the profile of the trench being etched.

27. The process of claim 26, wherein said passivation of the trench sidewalls comprises both:
   passivating the sidewalls on a molecular level, and passivating the sidewalls by a veneer type passivation of the sidewall.

28. The process of claim 27, further comprising:
   including in said plasma a precipitating agent.

29. The process of claim 27, further comprising:
   including in said plasma a polymerizing agent.

* * * * *